United States Patent
Pan et al.

(10) Patent No.: US 10,662,067 B1
(45) Date of Patent: May 26, 2020

(54) COMPOUND AMMONIUM FLUOROBORATE, NONLINEAR OPTICAL CRYSTAL OF AMMONIUM FLUOROBORATE, AND PREPARATION METHOD AND USE THEREOF

(71) Applicant: XINJIANG TECHNICAL INSTITUTE OF PHYSICS & CHEMISTRY, CHINESE ACADEMY OF SCIENCES, Urumqi (CN)

(72) Inventors: Shilie Pan, Urumqi (CN); Guoqiang Shi, Urumqi (CN); Fangfang Zhang, Urumqi (CN); Xueling Hou, Urumqi (CN)

(73) Assignee: XINJIANG TECHNICAL INSTITUTE OF PHYSICS & CHEMISTRY, CHINESE ACADEMY OF SCIENCES, Urumqi (CN)

( * ) Notice: Subject to any disclaimer, the term of this patent is extended or adjusted under 35 U.S.C. 154(b) by 193 days.

(21) Appl. No.: 16/070,286

(22) PCT Filed: Feb. 22, 2017

(86) PCT No.: PCT/CN2017/074336
§ 371 (c)(1),
(2) Date: Jul. 15, 2018

(87) PCT Pub. No.: WO2018/103201
PCT Pub. Date: Jun. 14, 2018

(30) Foreign Application Priority Data

Dec. 9, 2016 (CN) .......................... 2016 1 1128283

(51) Int. Cl.
*C01B 35/06* (2006.01)
*G02F 1/35* (2006.01)
(Continued)

(52) U.S. Cl.
CPC ................ *C01B 35/06* (2013.01); *C30B 7/10* (2013.01); *C30B 7/14* (2013.01); *C30B 9/12* (2013.01);
(Continued)

(58) Field of Classification Search
None
See application file for complete search history.

(56) References Cited

U.S. PATENT DOCUMENTS 9,715,160 B2 * 7/2017 Pan ........................ C01B 35/126
10,564,514 B1 * 2/2020 Pan .......................... C30B 15/00

FOREIGN PATENT DOCUMENTS

CN 101984149 A 3/2011
CN 102650075 A 8/2012
(Continued)

OTHER PUBLICATIONS

Guoqiang Shi, Ying Wang, Fangfang Zhang, Bingbing Zhang, Zhihua Yang, Xueling Hou, Shilie Pan, and Kenneth R. Poeppelmeier. "Finding the Next Deep-Ultraviolet Nonlinear Optical Material: NH4B4O6F." Journal of the American Chemical Society, 2017, vol. 139 (31), pp. 10645-10648. (Year: 2017).*

*Primary Examiner* — Rhonda S Peace
(74) *Attorney, Agent, or Firm* — Bayramoglu Law Offices LLC

(57) ABSTRACT

A compound ammonium fluoroborate, a nonlinear optical crystal of ammonium fluoroborate, and a preparation method and use thereof; the compound has the chemical formula of $NH_4B_4O_6F$ with a molecular weight of 176.28, and is prepared by a solid phase reaction process; the crystal has the chemical formula of $NH_4B_4O_6F$ with a molecular weight of 176.28, belongs to the orthorhombic system, and has a space group of $Pna2_1$ and the following unit cell parameters: a=7.615(3) Å, b=11.207(4) Å, c=6.604(3) Å, Z=4, V=563.6 Å$^3$. The nonlinear optical crystal can be
(Continued)

obtained by the method of the present invention. The present invention provides uses of the nonlinear optical crystal in producing harmonic light and a deep-ultraviolet frequency-multiplied light below 200 nm; and in making a frequency multiplication generator, a frequency up or down converter or an optical parametric oscillator.

8 Claims, 4 Drawing Sheets

(51) Int. Cl.
| | |
|---|---|
| *G02F 1/37* | (2006.01) |
| *G02F 1/39* | (2006.01) |
| *C30B 7/14* | (2006.01) |
| *C30B 9/12* | (2006.01) |
| *C30B 11/00* | (2006.01) |
| *C30B 29/12* | (2006.01) |
| *G02F 1/355* | (2006.01) |
| *C30B 7/10* | (2006.01) |

(52) U.S. Cl.
CPC ............ *C30B 11/00* (2013.01); *C30B 29/12* (2013.01); *G02F 1/353* (2013.01); *G02F 1/3551* (2013.01); *G02F 1/37* (2013.01); *G02F 1/39* (2013.01); *C01P 2002/74* (2013.01); *C01P 2002/76* (2013.01); *C01P 2002/77* (2013.01); *C01P 2002/78* (2013.01); *C01P 2002/82* (2013.01); *C01P 2002/85* (2013.01); *G02F 2001/354* (2013.01)

(56) References Cited

FOREIGN PATENT DOCUMENTS

| | | |
|---|---|---|
| CN | 103031601 A | 4/2013 |
| CN | 103590106 A | 2/2014 |

* cited by examiner

COMPOUND AMMONIUM FLUOROBORATE, NONLINEAR OPTICAL CRYSTAL OF AMMONIUM FLUOROBORATE, AND PREPARATION METHOD AND USE THEREOF

CROSS REFERENCE TO RELATED APPLICATIONS

This application is the national phase entry of International Application No. PCT/CN2017/074336, filed on Feb. 22, 2017, which is based upon and claims priority to Chinese Patent Application No. 201611128283.3, filed on Dec. 9, 2016, the entire contents of which are incorporated herein by reference.

TECHNICAL FIELD

The present invention relates to a compound ammonium fluoroborate $NH_4B_4O_6F$, a nonlinear optical crystal of ammonium fluoroborate $NH_4B_4O_6F$, and a preparation method and use thereof.

BACKGROUND

Recently, with the strong demand for the deep-ultraviolet laser source (generally refers to the laser source emitting a laser with a wavelength of shorter than 200 nm) of 193 nm lithography technology, micro-nano fine laser processing, and modern instruments such as ultra-high energy resolution photoelectron spectrometer and photoelectron emission microscopy, developing an all-solid-state deep-ultraviolet laser source has become a research hotspot of the international laser scientific community. The deep-ultraviolet nonlinear optical crystal is a key element to develop the all-solid-state deep-ultraviolet laser source.

Currently, the ultraviolet and deep-ultraviolet nonlinear optical crystals used in the industries mainly include $LiB_3O_5$ (LBO), $CsB_3O_5$ (CBO), $CsLiB_6O_{10}$ (CLBO), $BaB_2O_4$ (BBO), and $KBe_2BO_3F_2$ (KBBF) crystals. LBO crystal has a wide transmission region, a good optical homogeneity, a large effective frequency multiplication factor (3KDP) and a high damage threshold (18.9 GW/cm$^2$). However, LBO crystal is unable to achieve phase matching in the deep-ultraviolet region due to its relatively small birefringence ($\Delta n=0.04-0.05$) and the shortest second harmonic wavelength is 276 nm. Similar to LBO crystal, CBO and CLBO crystals also have limited applications in the deep-ultraviolet region due to the relatively small birefringence. Although BBO crystal has a large frequency-doubling coefficient and a large birefringence, its relatively high ultraviolet absorption cutoff edge (189 nm) and the shortest second harmonic wavelength of 204.8 nm limit its application in the deep-ultraviolet region. KBBF can output a frequency-sextupled light from a 1064 nm fundamental wavelength directly; however, it is difficult to grow a large-sized crystal due to the layered growth habit of KBBF, which limits its application to some extent. Therefore, there is an urgent need to develop a new deep-ultraviolet nonlinear optical crystal with good comprehensive performances.

SUMMARY OF THE INVENTION

One object of the present invention is to provide a compound ammonium fluoroborate with a chemical formula of $NH_4B_4O_6F$ and a molecular weight of 176.28. The compound is prepared using a solid phase reaction process.

Another object of the present invention is to provide a nonlinear optical crystal of ammonium fluoroborate $NH_4B_4O_6F$, with a chemical formula of $NH_4B_4O_6F$ and a molecular weight of 176.28, and the crystal belongs to an orthorhombic system, with a space group of Pna2$_1$, and has the following unit cell parameters: a=7.615(3) Å, b=11.207(4) Å, c=6.604(3) Å, Z=4, V=563.6 Å$^3$.

Yet another object of the present invention is to provide a method for preparing the nonlinear optical crystal of ammonium fluoroborate $NH_4B_4O_6F$ and use thereof.

The compound ammonium fluoroborate of the present invention has a chemical formula of $NH_4B_4O_6F$ and a molecular weight of 176.28, and prepared by a solid phase reaction process.

The method for preparing the compound ammonium fluoroborate comprises the steps of:

mixing an $NH_4$-containing compound, a Boron-containing compound, and a Fluorine-containing compound evenly at a molar ratio of $NH_4$:B:F=(0.5-2):(3-5):(0.5-2), sealing the mixture in a hydrothermal reactor or a quartz tube, placing the hydrothermal reactor or the quartz tube into a muffle furnace or a drying oven, raising the temperature to 150-580° C. at a rate of 20-40° C./h and keeping the temperature for 10-48 h, then reducing the temperature to 30° C. at a rate of 1-10° C./h, and opening the hydrothermal reactor or the quartz tube to obtain the compound $NH_4B_4O_6F$; wherein the $NH_4$-containing compound is $NH_4F$, the Boron-containing compound is $H_3BO_3$ and $B_2O_3$, and the Fluorine-containing compound is $NH_4F$ or HF.

The present invention provides a nonlinear optical crystal of ammonium fluoroborate with a chemical formula of $NH_4B_4O_6F$ and a molecular weight of 176.28, which belongs to an orthorhombic system, with a space group of Pna2$_1$, and has the following cell parameters: a=7.615(3) Å, b=11.207(4) Å, c=6.604(3) Å, Z=4, V=563.6 Å$^3$.

The methods for preparing the nonlinear optical crystal of ammonium fluoroborate include a flux method, a Bridgman-Stockbarger method, a room temperature solution method and a solvothermal method.

Said room temperature solution method for growing the nonlinear optical crystal of ammonium fluoroborate comprises the following steps:

a. mixing an $NH_4$-containing compound, a Boron-containing compound, and a Fluorine-containing compound evenly at a molar ratio of $NH_4$:B:F=(0.5-2):(3-5):(0.5-2), sealing the mixture in a hydrothermal reactor or a quartz tube, placing the hydrothermal reactor or the quartz tube into a muffle furnace or a drying oven, raising the temperature to 150-580° C. at a rate of 20-40° C./h and keeping the temperature for 10-48 h, then reducing the temperature to 30° C. at a rate of 1-10° C./h, and opening the hydrothermal reactor or the quartz tube and removing the product to obtain the compound $NH_4B_4O_6F$;

wherein the $NH_4$-containing compound is $NH_4F$, the Boron-containing compound is $H_3BO_3$ or $B_2O_3$, and the Fluorine-containing compound is $NH_4F$ or HF;

b. sealing the compound $NH_4B_4O_6F$ obtained in step a in a hydrothermal reactor or a quartz tube, placing the hydrothermal reactor or the quartz tube into a muffle furnace or a drying oven, raising the temperature to 200-600° C. at a rate of 20-40° C./h and keeping the temperature for 10-48 h, then reducing the temperature to 30° C. at a rate of 1-5° C./h, and opening the hydrothermal reactor or the quartz tube to obtain a seed crystal of $NH_4B_4O_6F$;

c. placing the seed crystal obtained in step b at the bottom of a container, and then placing the compound $NH_4B_4O_6F$ obtained in step a into the container;

d. sealing the container in step c or sealing the container in step c after the addition of 10-100 mL of a solvent, placing the container into a muffle furnace or a drying oven, raising the temperature to 150-600° C. at a rate of 20-40° C./h and keeping the temperature for 10-48 h, then reducing the temperature to 50° C. at a rate of 1-3° C./day, and then reducing the temperature to 30° C. at a rate of 1-10° C./h, and opening the container to obtain the nonlinear optical crystal of $NH_4B_4O_6F$ with a size of 1-20 mm; wherein the solvent is deionized water, anhydrous ethanol, N,N-dimethylformamide, N,N-dimethylacetamide or hydrofluoric acid.

Said flux method for growing the nonlinear optical crystal of ammonium fluoroborate comprises the following steps:

a. mixing an $NH_4$-containing compound, a Boron-containing compound, and an Fluorine-containing compound evenly at a molar ratio of $NH_4$:B:F=(0.5-2):(3-5):(0.5-2), sealing the mixture in a hydrothermal reactor or a quartz tube, placing the hydrothermal reactor or the quartz tube into a muffle furnace or a drying oven, raising the temperature to 150-580° C. at a rate of 20-40° C./h and keeping the temperature for 10-48 h, then reducing the temperature to 30° C. at a rate of 1-10° C./h, and opening the hydrothermal reactor or the quartz tube to obtain the compound $NH_4B_4O_6F$;

wherein the $NH_4$-containing compound is $NH_4F$, the Boron-containing compound is $H_3BO_3$ or $B_2O_3$, and the Fluorine-containing compound is $NH_4F$ or HF;

b. sealing the compound $NH_4B_4O_6F$ obtained in step a in a hydrothermal reactor or a quartz tube, placing the hydrothermal reactor or the quartz tube into a muffle furnace or a drying oven, raising the temperature to 200-600° C. at a rate of 20-40° C./h and keeping the temperature for 10-48 h, then reducing the temperature to 30° C. at a rate of 1-5° C./h, and opening the hydrothermal reactor or the quartz tube to obtain a seed crystal of $NH_4B_4O_6F$;

c. placing the seed crystal of $NH_4B_4O_6F$ obtained in step b at the bottom of a quartz tube, then mixing the compound $NH_4B_4O_6F$ obtained in step a with a flux at a molar ratio of 1:(1-10) and placing the mixture into the quartz tube, and the tube was lame-sealed under $10^{-3}$ Pa with a flame gun; wherein the flux is $NH_4F$, $NH_4F:H_3BO_3$, $NH_4F:B_2O_3$, $H_3BO_3$ or $B_2O_3$;

d. sealing the quartz tube in step c or sealing the quartz tube in step c after the addition of 10-100 mL of a solvent, placing the quartz tube into a muffle furnace or a drying oven, raising the temperature to 150-600° C. at a rate of 20-40° C./h and keeping the temperature for 10-48 h, then reducing the temperature to 50° C. at a rate of 1-3° C./day, and then reducing the temperature to 30° C. at a rate of 1-10° C./h, and opening the container and removing the product to obtain the nonlinear optical crystal of $NH_4B_4O_6F$ with a size of 1-20 mm; wherein the solvent is deionized water, anhydrous ethanol, N,N-dimethylformamide, N,N-dimethylacetamide or hydrofluoric acid.

Said Bridgman-Stockbarger method for growing the nonlinear optical crystal of ammonium fluoroborate comprises the following steps:

a. mixing an $NH_4$-containing compound, a Boron-containing compound, and an Fluorine-containing compound evenly at a molar ratio of $NH_4$:B:F=(0.5-2):(3-5):(0.5-2), sealing the mixture in a hydrothermal reactor or a quartz tube, placing the hydrothermal reactor or the quartz tube into a muffle furnace or a drying oven, raising the temperature to 150-580° C. at a rate of 20-40° C./h and keeping the temperature for 10-48 h, then reducing the temperature to 30° C. at a rate of 1-10° C./h, and opening the hydrothermal reactor or the quartz tube and removing the product to obtain the compound $NH_4B_4O_6F$;

wherein the $NH_4$-containing compound is $NH_4F$, the Boron-containing compound is $H_3BO_3$ or $B_2O_3$, and the Fluorine-containing compound is $NH_4F$ or HF;

b. sealing the compound $NH_4B_4O_6F$ obtained in step a in a hydrothermal reactor or a quartz tube, placing the hydrothermal reactor or the quartz tube into a muffle furnace or a drying oven, raising the temperature to 200-600° C. at a rate of 20-40° C./h and keeping the temperature for 10-48 h, then reducing the temperature to 30° C. at a rate of 1-5° C./h, and opening the hydrothermal reactor or the quartz tube to obtain a seed crystal of $NH_4B_4O_6F$;

c. placing the seed crystal obtained in step b at the bottom of a container, and then placing the compound $NH_4B_4O_6F$ obtained in step a into the container;

d. sealing the container in step c and placing the container into a Bridgman-Stockbarger furnace, raising the temperature to 300-600° C. and keeping the temperature for 10-20 h, adjusting the position of the container to allow the compound $NH_4B_4O_6F$ to spontaneously nucleate or inoculate at 350-600° C., then lowering the container at a rate of 0.05-2 mm/h slowly while keeping the growth temperature constant or reducing the temperature slowly at a rate of 0-3° C./h, then reducing the temperature of the furnace to 30° C. after the growth of the crystal is completed, and removing the container to obtain the nonlinear optical crystal of $NH_4B_4O_6F$ with a size of 1-20 mm.

Said solvothermal method for growing the nonlinear optical crystal of ammonium fluoroborate comprises the following steps:

a. mixing an $NH_4$-containing compound, a Boron-containing compound, and a Fluorine-containing compound evenly at a molar ratio of $NH_4$:B:F=(0.5-2):(3-5):(0.5-2), sealing the mixture in a hydrothermal reactor or a quartz tube, placing the hydrothermal reactor or the quartz tube into a muffle furnace or a drying oven, raising the temperature to 150-580° C. at a rate of 20-40° C./h and keeping the temperature for 10-48 h, then reducing the temperature to 30° C. at a rate of 1-10° C./h, and opening the hydrothermal reactor or the quartz tube to obtain the compound $NH_4B_4O_6F$;

wherein the $NH_4$-containing compound is $NH_4F$, the Boron-containing compound is $H_3BO_3$ or $B_2O_3$, and the Fluorine-containing compound is $NH_4F$ or HF;

b. sealing the compound $NH_4B_4O_6F$ obtained in step a in a hydrothermal reactor or a quartz tube, placing the hydrothermal reactor or the quartz tube into a muffle furnace or a drying oven, raising the temperature to 200-600° C. at a rate of 20-40° C./h and keeping the temperature for 10-48 h, then reducing the temperature to 30° C. at a rate of 1-5° C./h, and opening the hydrothermal reactor or the quartz tube to obtain a seed crystal of $NH_4B_4O_6F$:

c. placing the seed crystal obtained in step b at the bottom of a container, and then placing the compound $NH_4B_4O_6F$ obtained in step a into the container;

d. adding 10-100 mL of a solvent to the container in step c, then subjecting the mixture to ultrasonication to make the mixture mix and dissolve thoroughly, adjusting the pH value of the mixture to pH=1-11, performing filtration with a qualitative filter paper, then sealing the container with a polyvinyl chloride film in which several small holes are punched to adjust the volatilization rate of the solvent in the solution, and placing the container into a static environment without shaking, pollution and air convection, and leaving the mixture to stand at room temperature to allow the crystal to grow, so as to obtain the nonlinear optical crystal of $NH_4B_4O_6F$ with a size of 1-20 mm at the end of the crystal growth; wherein the solvent is deionized water, anhydrous ethanol, N,N-dimethylformamide, N,N-dimethylacetamide or hydrofluoric acid.

In step c of the preparation process by the flux method, the molar ratio of $NH_4F$ to $H_3BO_3$ in the flux system of $NH_4F$—$H_3BO_3$ is (1-3):(1-5); and the molar ratio of $NH_4F$ to $B_2O_3$ in the $NH_4F$—$B_2O_3$ system is (1-2):(1-4).

The present invention provides use of the nonlinear optical crystal of ammonium fluoroborate in the production of a frequency-doubled, frequency-tripled, frequency-quadrupled, frequency-quintupled or frequency-sextupled harmonic light from a 1064 nm fundamental light output from a Nd:YAG laser.

The present invention provides use of the nonlinear optical crystal of ammonium fluoroborate in producing a deep-ultraviolet frequency-multiplied light below 200 nm.

The present invention provides use of the nonlinear optical crystal of ammonium fluoroborate in the make of a frequency multiplication generator, a frequency up or down converter or an optical parametric oscillator.

Wherein the container used in the methods is a platinum crucible, iridium crucible, ceramic crucible, quartz tube, conical flask, beaker, or hydrothermal reactor lined with polytetrafluoroethylene or lined with stainless steel with a platinum sleeve. When the container is a quartz tube, vacuumization is required before sealing to avoid the burst of the quartz tube resulting from the gas released in the reaction. When the container is a conical flask or beaker, it needs to be washed with acid, then rinsed with deionized water, and dried.

Seven compounds, that is $KB_4O_6F$, $RbB_4O_6F$, $CsB_4O_6F$, $NH_4B_4O_6OH$, $KB_4O_6OH$, $RbB_4O_6OH$ and $CsB_4O_6OH$ can be synthesized on the basis of $NH_4B_4O_6F$. The seven compounds have similar properties to $NH_4B_4O_6F$, for example: all of them have nonlinear optical coefficients of approximate 0.5-4 KDP and ultraviolet absorption cutoff edges of less than 200 nm, and can be used to output the frequency-doubled, frequency-tripled, frequency-quadrupled, frequency-quintupled or frequency-sextupled harmonic light based on the 1064 nm fundamental light output from an Nd:YAG laser, or used to output the deep-ultraviolet frequency-multiplied light of below 200 nm.

With the method for preparing the nonlinear optical crystal of ammonium fluoroborate of the present invention, the centimeter-sized nonlinear optical crystal of $NH_4B_4O_6F$ can be obtained and the crystal has no obvious layered growth habit. When a large-sized crucible or container is used and the growth cycle of the crystal is prolonged, the corresponding large-sized nonlinear optical crystal of $NH_4B_4O_6F$ can be obtained. During the growth of the nonlinear optical crystal of $NH_4B_4O_6F$, the crystal is easy to grow up, transparent and with out inclusion, and has the advantages of high growth rate, low cost, and easy to obtain large-sized crystals and so on.

The large-sized nonlinear optical crystal of $NH_4B_4O_6F$ obtained by the method for preparing the nonlinear optical crystal of ammonium fluoroborate in the present invention can be used as a nonlinear optical device by orienting the raw crystal based on the crystallographic data of the crystal, cutting the crystal according to the desired angle, thickness and sectional size, and polishing the transmission surface of the crystal. The nonlinear optical crystal of $NH_4B_4O_6F$ has the advantages of a wide transmission region, stable physical and chemical properties, a high mechanical hardness, hard to break and deliquesce, easy to cut, polish and preserve and so on.

DETAILED DESCRIPTION OF THE INVENTION

Figure 1:
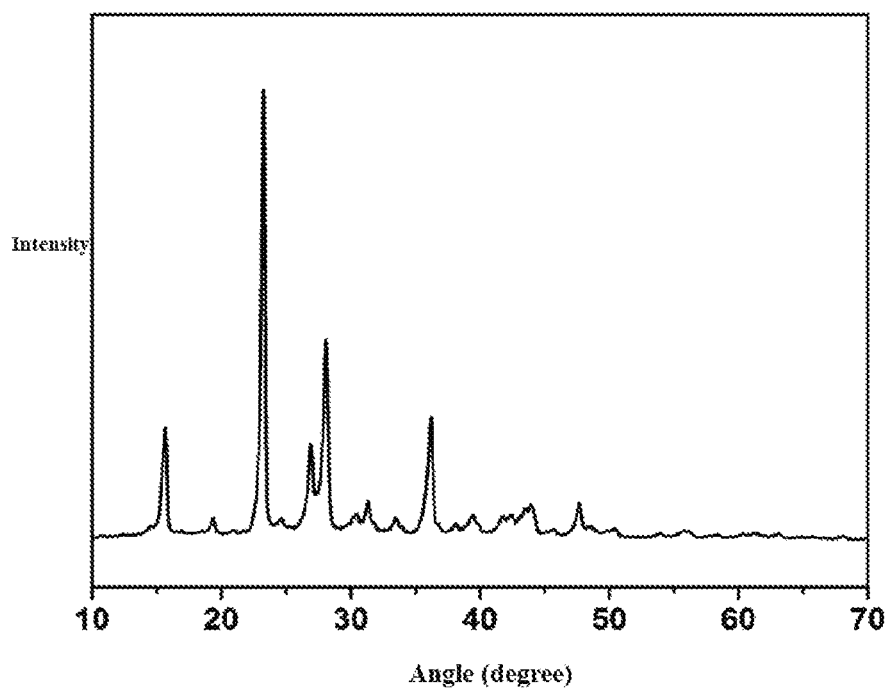
FIG. 1 shows the powder XRD spectrum of the compound $NH_4B_4O_6F$ of the present invention, which is consistent with the theoretical XRDspectrum, demonstrating the presence of the compound $NH_4B_4O_6F$.
Figure 2:
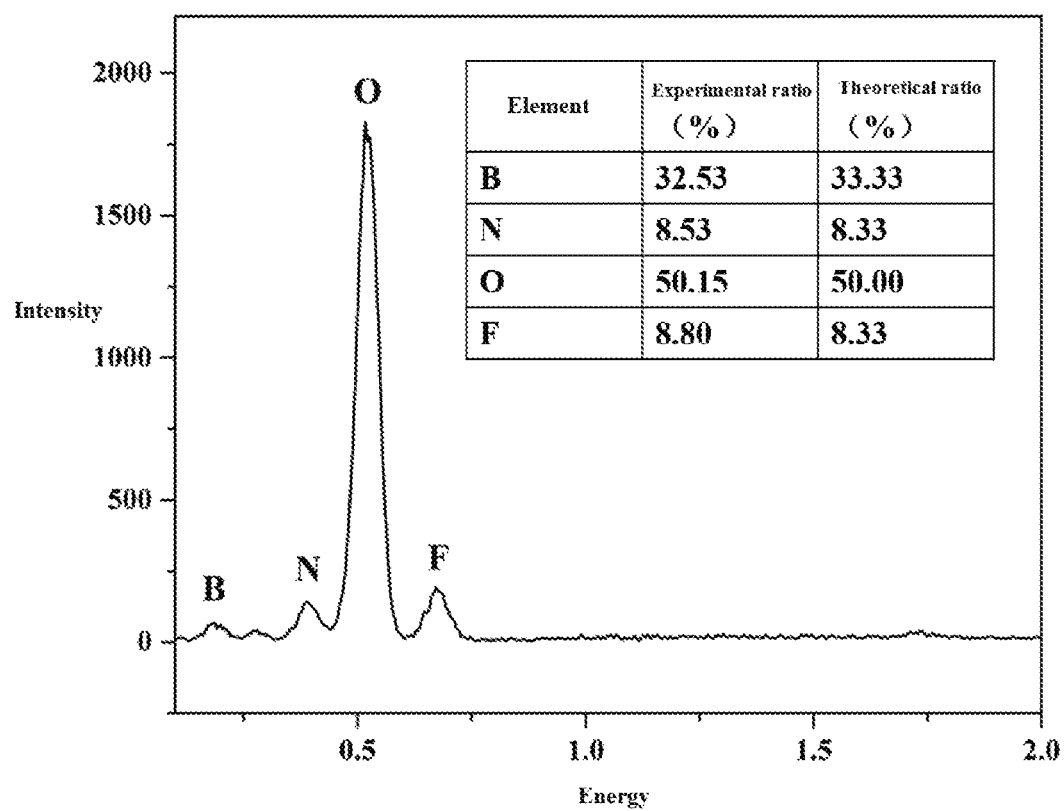
FIG. 2 shows the EDS spectrum of the compound $NH_4B_4O_6F$ of the present invention, which shows that the experimental and theoretical atomic ratios are basically the same, demonstrating the accuracy of the chemical formula $NH_4B_4O_6F$ of the compound.
Figure 3:
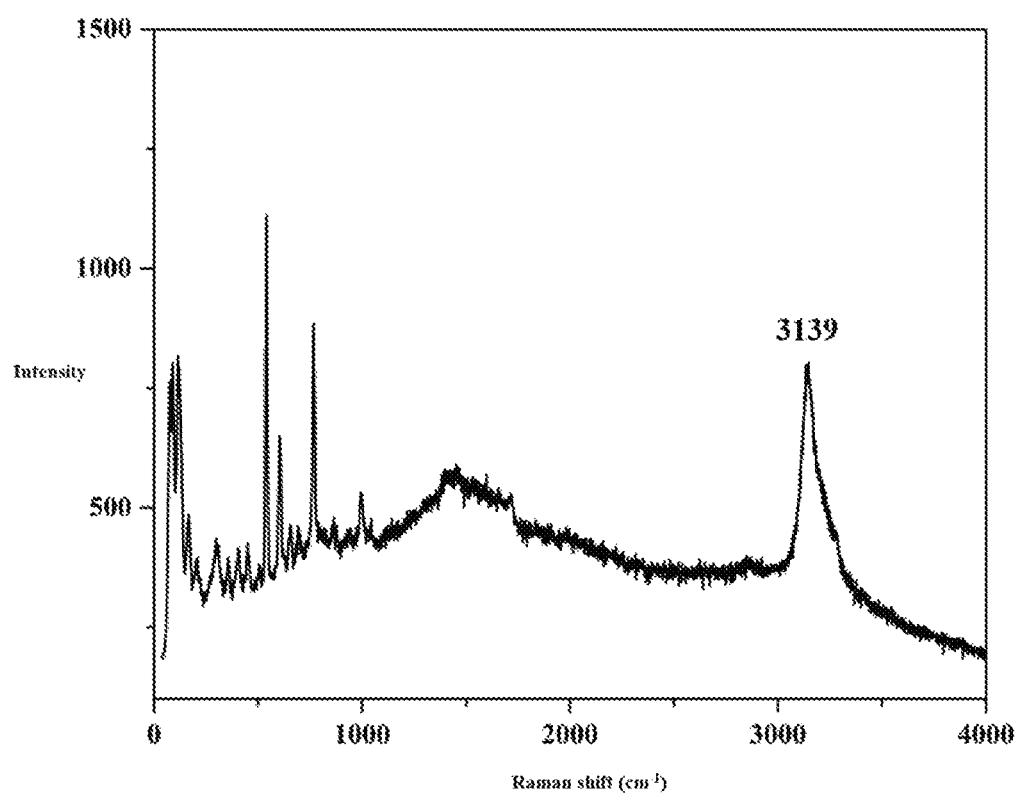
FIG. 3 shows the Raman spectrum of the compound $NH_4B_4O_6F$ of the present invention, in which the peak at 3139 $cm^{-1}$ demonstrates the presence of $NH^{4+}$.
Figure 4:
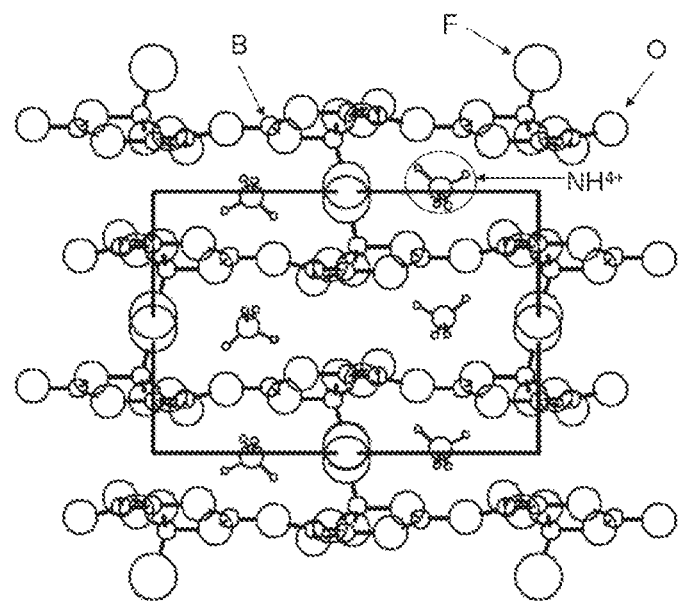
FIG. 4 shows the structure of the $NH_4B_4O_6F$ crystal of the present invention.

The present invention will be further described in combination with the following examples. It should be noted that, the following examples are not intended to limit the protection scope of the present invention, and any alternations made based on the present invention do not against the spirit of the present invention. The raw materials or equipment used in the present invention are commercially available unless otherwise stated.

Example 1: Compound Preparation

The compound $NH_4B_4O_6F$ was synthesized by the solid phase reaction process based on the reaction equation $NH_4F+2B_2O_3 \rightarrow NH_4B_4O_6F$.

$NH_4F$ and $B_2O_3$ were mixed uniformly at a molar ratio of 1:1.5 and placed into a Φ10 mm quartz tube. The quartz tube was vacuumized to reach a vacuum degree of $1 \times 10^{-3}$ Pa and sealed with a flame gun, and then placed into a muffle furnace. The temperature was raised to 400° C. at a rate of 30° C./h and kept for 24 h and then reduced to 30° C. at a rate of 6° C./h, and the quartz tube was opened to obtain the compound $NH_4B_4O_6F$.

Example 2: Compound Preparation

The compound $NH_4B_4O_6F$ was synthesized by the solid phase reaction process based on the reaction equation $NH_4F+4H_3BO_3 \rightarrow NH_4B_4O_6F+6H_2\uparrow$.

$NH_4F$ and $H_3BO_3$ were mixed uniformly at a molar ratio of 1:3.5 and placed into a hydrothermal reactor having a volume of 23 mL and lined with polytetrafluoroethylene. The hydrothermal reactor was screwed tightly to be sealed and then was placed into a drying oven. The temperature was raised to 220° C. at a rate of 35° C./h and kept for 24 h and then reduced to 30° C. at a rate of 6° C./h, and the hydrothermal reactor was opened to obtain the compound $NH_4B_4O_6F$.

Example 3: Synthesis of the Nonlinear Optical Crystal of $NH_4B_4O_6F$ by the Room Temperature Solution Method The compound $NH_4B_4O_6F$ was synthesized according to the specific operation steps in Example 1 based on the reaction equation $NH_4F+2B_2O_3 \rightarrow NH_4B_4O_6F$.

The resultant compound $NH_4B_4O_6F$ was sealed in a hydrothermal reactor and then the hydrothermal reactor was placed into a drying oven. The temperature was raised to 200° C. at a rate of 20° C./h and kept for 10 h and then reduced to 30° C. at a rate of 1° C./h, and the hydrothermal reactor was opened to obtain a seed crystal of $NH_4B_4O_6F$.

The resultant seed crystal was placed at the bottom of a clean beaker and then the resultant compound $NH_4B_4O_6F$ were placed into the beaker.

10 mL of hydrofluoric acid was added to the beaker as a solvent. The mixture was mixed and dissolved thoroughly by ultrasonication, adjusted to pH=5-6, and filtered with a qualitative filter paper. The beaker was sealed with a polyvinyl chloride film in which several small holes were punched to adjust the volatilization rate of the solvent in the solution, and was placed into a static environment without shaking, pollution and air convection. The mixture was left to stand at room temperature to obtain the $NH_4B_4O_6F$ crystal with a size of 5 mm×6 mm×8 mm at the end of the crystal growth.

Example 4: Synthesis of the Nonlinear Optical Crystal of $NH_4B_4O_6F$ by the Room Temperature Solution Method The compound $NH_4B_4O_6F$ was synthesized according to the specific operation steps in Example 1 based on the reaction equation $NH_4F+2B_2O_3 \rightarrow NH_4B_4O_6F$.

The resultant compound $NH_4B_4O_6F$ was placed into a $\varphi$10 mm quartz tube. The quartz tube was vacuumized to reach a vacuum degree of $1\times10^{-3}$ Pa and sealed with a flame gun, and then placed into a muffle furnace. The temperature was raised to 600° C. at a rate of 40° C./h and kept for 48 h and then reduced to 30° C. at a rate of 5° C./h, and the quartz tube was opened to obtain a seed crystal of $NH_4B_4O_6F$.

The resultant seed crystal was placed at the bottom of a conical flask and then the resultant compound $NH_4B_4O_6F$ were placed into the conical flask.

100 mL of anhydrous ethanol was added to the conical flask. The mixture was mixed and dissolved thoroughly by ultrasonication, and then filtered with a qualitative filter paper. The conical flask was sealed with a polyvinyl chloride film in which several small holes were punched to adjust the volatilization rate of the solvent in the solution, and was placed into a static environment without shaking, pollution and air convection. The mixture was left to stand at room temperature to obtain the $NH_4B_4O_6F$ crystal with a size of 7 mm×6 mm×4 mm at the end of the crystal growth.

Example 5: Growth of the $NH_4B_4O_6F$ Crystal by the Room Temperature Solution Method The compound $NH_4B_4O_6F$ was synthesized according to the specific operation steps in Example 2 based on the reaction equation $NH_4F+4H_3BO_3 \rightarrow NH_4B_4O_6F+6H_2O\uparrow$.

The resultant compound $NH_4B_4O_6F$ was sealed in a hydrothermal reactor. Then the hydrothermal reactor was placed into a drying oven. The temperature was raised to 300° C. at a rate of 30° C./h and kept for 20 h and then reduced to 30° C. at a rate of 2° C./h, and the hydrothermal reactor was opened to obtain a seed crystal of $NH_4B_4O_6F$.

The resultant seed crystal was placed at the bottom of a beaker and then the compound $NH_4B_4O_6F$ obtained in step a was placed into the beaker.

N,N-dimethylacetamide was added to the beaker. The mixture was mixed and dissolved thoroughly by ultrasonication, and then filtered with a qualitative filter paper. The beaker was sealed with a polyvinyl chloride film in which several small holes were punched to adjust the volatilization rate of the solvent in the solution, and was placed into a static environment without shaking, pollution and air convection. The mixture was left to stand at room temperature to obtain the $NH_4B_4O_6F$ crystal with a size of 13 mm×8 mm×5 mm at the end of the crystal growth.

Example 6: Growth of the $NH_4B_4O_6F$ Crystal by the Flux Method

The compound $NH_4B_4O_6F$ was synthesized according to the specific operation steps in Example 2 based on the reaction equation $NH_4F+4H_3BO_3 \rightarrow NH_4B_4O_6F+6H_2O\uparrow$.

The resultant compound $NH_4B_4O_6F$ was placed into a $\Phi$10 mm quartz tube. The quartz tube was vacuumized to reach a vacuum degree of $1\times10^{-3}$ Pa and sealed with a flame gun and then placed into a muffle furnace. The temperature was raised to 400° C. at a rate of 30° C./h and kept for 30 h and then reduced to 30° C. at a rate of 2° C./h, and the quartz tube was opened to obtain a seed crystal of $NH_4B_4O_6F$.

The resultant seed crystal of $NH_4B_4O_6F$ was placed at the bottom of a quartz tube. Then the resultant compound $NH_4B_4O_6F$ and the flux $NH_4F$ were mixed at a molar ratio of 1:2, and placed into the quartz tube. The quartz tube was vacuumized to reach a vacuum degree of $1\times10^{-3}$ Pa and sealed with a flame gun.

Then the quartz tube was placed into a muffle furnace. The temperature was raised to 500° C. at a rate of 30° C./h and kept for 24 h, then reduced to 450° C. at a rate of 1.5° C./day, and then reduced to 30° C. at a rate of 2° C./h, and the quartz tube was cut to obtain the $NH_4B_4O_6F$ crystal with a size of 5 mm×7 mm×9 mm.

Example 7: Growth of the $NH_4B_4O_6F$ Crystal by the Flux Method

The compound $NH_4B_4O_6F$ was synthesized according to the specific operation steps in Example 1 based on the reaction equation $NH_4F+2B_2O_3 \rightarrow NH_4B_4O_6F$.

The resultant compound $NH_4B_4O_6F$ was placed into a $\Phi$10 mm quartz tube. The quartz tube was vacuumized to reach a vacuum degree of $1\times10^{-3}$ Pa and sealed with a flame gun and then placed into a muffle furnace. The temperature was raised to 300° C. at a rate of 20° C./h and kept for 10 h and then reduced to 30° C. at a rate of 1° C./h, and the quartz tube was opened to obtain a seed crystal of $NH_4B_4O_6F$.

The seed crystal of $NH_4B_4O_6F$ was placed at the bottom of a $\Phi$10 mm quartz tube. Then the compound $NH_4B_4O_6F$ and the flux $NH_4F$—$H_3BO_3$ (wherein the molar ratio of $NH_4F$ to $H_3BO_3$ is 1:1) were mixed at a molar ratio of 1:1, and placed into the quartz tube. The quartz tube was vacuumized to reach a vacuum degree of $1\times10^{-3}$ Pa and sealed with a flame gun.

Then the quartz tube was placed into a muffle furnace. The temperature was raised to 450° C. at a rate of 30° C./h and kept for 24 h, then reduced to 400° C. at a rate of 1.5° C./day, and then reduced to 30° C. at a rate of 2° C./h, and the quartz tube was cut to obtain the $NH_4B_4O_6F$ crystal with a size of 10 mm×7 mm×6 mm.

Example 8: Growth of the $NH_4B_4O_6F$ Crystal by the Flux Method

The compound $NH_4B_4O_6F$ was synthesized according to the specific operation steps in Example 2 based on the reaction equation $NH_4F+4H_3BO_3 \rightarrow NH_4B_4O_6F+6H_2O\uparrow$.

The resultant compound $NH_4B_4O_6F$ was placed into a Φ10 mm quartz tube. The quartz tube was vacuumized to reach a vacuum degree of $1\times10^{-3}$ Pa and sealed with a flame gun and then placed into a muffle furnace. The temperature was raised to 500° C. at a rate of 40° C./h and kept for 40 h and then reduced to 30° C. at a rate of 4° C./h, and the quartz tube was opened to obtain a seed crystal of $NH_4B_4O_6F$.

The resultant seed crystal of $NH_4B_4O_6F$ was placed at the bottom of a quartz tube. Then the resultant compound $NH_4B_4O_6F$ and the flux $NH_4F$—$B_2O_3$ (the molar ratio of $NH_4F$ to $B_2O_3$ is 1:4) were mixed at a molar ratio of 1:5, and placed into the quartz tube. The quartz tube was vacuumized to reach a vacuum degree of $1\times10^{-3}$ Pa and sealed with a flame gun.

Then the quartz tube was placed into a muffle furnace. The temperature was raised to 450° C. at a rate of 40° C./h and kept for 20 h, then reduced to 400° C. at a rate of 2° C./day, and then reduced to 30° C. at a rate of 3° C./h, and the quartz tube was cut to obtain the $NH_4B_4O_6F$ crystal with a size of 5 mm×7 mm×8 mm.

Example 9: Growth of the $NH_4B_4O_6F$ Crystal by the Flux Method

The compound $NH_4B_4O_6F$ was synthesized according to the specific operation steps in Example 1 based on the reaction equation $NH_4F+2B_2O_3 \rightarrow NH_4B_4O_6F$.

The resultant compound $NH_4B_4O_6F$ was placed into a Φ10 mm quartz tube. The quartz tube was vacuumized to reach a vacuum degree of $1\times10^{-3}$ Pa and sealed with a flame gun and then placed into a muffle furnace. The temperature was raised to 300° C. at a rate of 25° C./h and kept for 30 h and then reduced to 30° C. at a rate of 3° C./h, and the quartz tube was opened to obtain a seed crystal of $NH_4B_4O_6F$.

The seed crystal of $NH_4B_4O_6F$ was placed at the bottom of a Φ10 mm quartz tube. Then the compound $NH_4B_4O_6F$ and the flux $H_3BO_3$ were mixed at a molar ratio of 1:5, and placed into the quartz tube. The quartz tube was vacuumized to reach a vacuum degree of $1\times10^{-3}$ Pa and sealed with a flame gun.

Then the quartz tube was placed into a muffle furnace. The temperature was raised to 600° C. at a rate of 40° C./h and kept for 48 h, then reduced to 550° C. at a rate of 3° C./day, and then reduced to 30° C. at a rate of 10° C./h, and the quartz tube was cut to obtain the $NH_4B_4O_6F$ crystal with a size of 8 mm×7 mm×6 mm.

Example 10: Growth of the $NH_4B_4O_6F$ Crystal by the Flux Method

The compound $NH_4B_4O_6F$ was synthesized according to the specific operation steps in Example 1 based on the reaction equation $NH_4F+2B_2O_3 \rightarrow NH_4B_4O_6F$.

The resultant compound $NH_4B_4O_6F$ was sealed in a hydrothermal reactor and the hydrothermal reactor was placed into a drying oven. The temperature was raised to 200° C. at a rate of 25° C./h and kept for 15 h and then reduced to 30° C. at a rate of 3° C./h, and the hydrothermal reactor was opened to obtain a seed crystal of $NH_4B_4O_6F$.

The seed crystal of $NH_4B_4O_6F$ was placed at the bottom of a Φ10 mm quartz tube. Then the compound $NH_4B_4O_6F$ and the flux $NH_4F$—$H_3BO_3$ (the molar ratio of $NH_4F$ to $H_3BO_3$ is 2:3) were mixed at a molar ratio of 1:10, and placed into the quartz tube. The quartz tube was vacuumized to reach a vacuum degree of $1\times10^{-3}$ Pa and sealed with a flame gun.

Then the quartz tube was placed into a muffle furnace. The temperature was raised to 450° C. at a rate of 30° C./h and kept for 24 h, then reduced to 400° C. at a rate of 1.5° C./day, and then reduced to 30° C. at a rate of 2° C./h, and the quartz tube was cut to obtain the $NH_4B_4O_6F$ crystal with a size of 8 mm×6 mm×4 mm.

Example 11: Growth of the $NH_4B_4O_6F$ Crystal by the Flux Method

The compound $NH_4B_4O_6F$ was synthesized according to the specific operation steps in Example 2 based on the reaction equation $NH_4F+4H_3BO_3 \rightarrow NH_4B_4O_6F+6H_2O\uparrow$.

The resultant compound $NH_4B_4O_6F$ was placed into a Φ10 mm quartz tube. The quartz tube was vacuumized to reach a vacuum degree of $1\times10^{-3}$ Pa and sealed with a flame gun and then placed into a muffle furnace. The temperature was raised to 500° C. at a rate of 40° C./h and kept for 40 h and then reduced to 30° C. at a rate of 4° C./h, and the quartz tube was opened to obtain a seed crystal of $NH_4B_4O_6F$.

The resultant seed crystal of $NH_4B_4O_6F$ was placed at the bottom of a quartz tube. Then the resultant compound $NH_4B_4O_6F$ and the flux $NH_4F$—$B_2O_3$ (the molar ratio of $NH_4F$ to $B_2O_3$ is 1:4) were mixed at a molar ratio of 1:5, and placed into the quartz tube. The quartz tube was vacuumized to reach a vacuum degree of $1\times10^{-3}$ Pa and sealed with a flame gun.

Then the quartz tube was placed into a muffle furnace. The temperature was raised to 400° C. at a rate of 40° C./h and kept for 20 h, then reduced to 350° C. at a rate of 2° C./day, and then reduced to 30° C. at a rate of 3° C./h, and the quartz tube was cut to obtain the $NH_4B_4O_6F$ crystal with a size of 5 mm×7 mm×7 mm.

Example 12: Growth of the $NH_4B_4O_6F$ Crystal by the Flux Method

The compound $NH_4B_4O_6F$ was synthesized according to the specific operation steps in Example 1 based on the reaction equation $NH_4F+2B_2O_3 \rightarrow NH_4B_4O_6F$.

The resultant compound $NH_4B_4O_6F$ was sealed in a hydrothermal reactor and the hydrothermal reactor was placed into a drying oven. The temperature was raised to 200° C. at a rate of 25° C./h and kept for 30 h and then reduced to 30° C. at a rate of 3° C./h, and the hydrothermal reactor was opened to obtain a seed crystal of $NH_4B_4O_6F$.

The seed crystal of $NH_4B_4O_6F$ was placed at the bottom of a Φ10 mm quartz tube. Then the compound $NH_4B_4O_6F$ and the flux $H_3BO_3$ were mixed at a molar ratio of 1:5, and placed into the quartz tube. The quartz tube was vacuumized to reach a vacuum degree of $1\times10^{-3}$ Pa and sealed with a flame gun.

Then the quartz tube was placed into a muffle furnace. The temperature was raised to 600° C. at a rate of 40° C./h and kept for 48 h, then reduced to 550° C. at a rate of 3° C./day, and then reduced to 30° C. at a rate of 10° C./h, and the quartz tube was cut to obtain the $NH_4B_4O_6F$ crystal with a size of 8 mm×6 mm×4 mm.

Example 13: Growth of the $NH_4B_4O_6F$ Crystal by the Flux Method

The compound $NH_4B_4O_6F$ was synthesized according to the specific operation steps in Example 2 based on the reaction equation $NH_4F+4H_3BO_3 \rightarrow NH_4B_4O_6F+6H_2O\uparrow$.

The resultant compound $NH_4B_4O_6F$ was placed into a Φ10 mm quartz tube. The quartz tube was vacuumized to reach a vacuum degree of $1\times10^{-3}$ Pa and sealed with a flame gun and then placed into a muffle furnace. The temperature was raised to 550° C. at a rate of 35° C./h and kept for 40 h and then reduced to 30° C. at a rate of 5° C./h, and the quartz tube was opened to obtain a seed crystal of $NH_4B_4O_6F$.

The resultant seed crystal of $NH_4B_4O_6F$ was placed at the bottom of a quartz tube. Then the resultant compound $NH_4B_4O_6F$ and the flux $NH_4F$—$B_2O_3$ (the molar ratio of $NH_4F$ to $B_2O_3$ is 2:4) were mixed at a molar ratio of 1:5, and placed into the quartz tube. The quartz tube was vacuumized to reach a vacuum degree of $1\times10^{-3}$ Pa and sealed with a flame gun.

Then the quartz tube was placed into a muffle furnace. The temperature was raised to 450° C. at a rate of 35° C./h and kept for 36 h, then reduced to 400° C. at a rate of 4° C./day, and then reduced to 30° C. at a rate of 10° C./h, and the quartz tube was cut to obtain the $NH_4B_4O_6F$ crystal with a size of 5 mm×7 mm×9 mm.

Example 14: Growth of the $NH_4B_4O_6F$ Crystal by the Flux Method

The compound $NH_4B_4O_6F$ was synthesized according to the specific operation steps in Example 1 based on the reaction equation $NH_4F+2B_2O_3 \rightarrow NH_4B_4O_6F$.

The resultant compound $NH_4B_4O_6F$ was placed into a Φ10 mm quartz tube. The quartz tube was vacuumized to reach a vacuum degree of $1\times10^{-3}$ Pa and sealed with a flame gun and then placed into a muffle furnace. The temperature was raised to 550° C. at a rate of 40° C./h and kept for 25 h and then reduced to 30° C. at a rate of 4° C./h, and the quartz tube was cut to obtain a seed crystal of $NH_4B_4O_6F$.

The seed crystal of $NH_4B_4O_6F$ was placed at the bottom of a Φ10 mm quartz tube. Then the compound $NH_4B_4O_6F$ and the flux $NH_4F$—$H_3BO_3$ (the molar ratio of $NH_4F$ to $H_3BO_3$ is 3:5) were mixed at a molar ratio of 1:10, and placed into the quartz tube. The quartz tube was vacuumized to reach a vacuum degree of $1\times10^{-3}$ Pa and sealed with a flame gun.

Then the quartz tube was placed into a muffle furnace. The temperature was raised to 550° C. at a rate of 40° C./h and kept for 40 h, then reduced to 500° C. at a rate of 3° C./day, and then reduced to 30° C. at a rate of 8° C./h, and the quartz tube was cut to obtain the $NH_4B_4O_6F$ crystal with a size of 9 mm×7 mm×6 mm.

Example 15: Growth of the $NH_4B_4O_6F$ Crystal by the Flux Method

The compound $NH_4B_4O_6F$ was synthesized according to the specific operation steps in Example 1 based on the reaction equation $NH_4F+2B_2O_3 \rightarrow NH_4B_4O_6F$.

The resultant compound $NH_4B_4O_6F$ was placed into a Φ10 mm quartz tube. The quartz tube was vacuumized to reach a vacuum degree of $1\times10^{-3}$ Pa and sealed with a flame gun and then placed into a muffle furnace. The temperature was raised to 500° C. at a rate of 30° C./h and kept for 15 h and then reduced to 30° C. at a rate of 5° C./h, and the hydrothermal reactor or the quartz tube was opened to obtain a seed crystal of $NH_4B_4O_6F$.

The seed crystal of $NH_4B_4O_6F$ was placed at the bottom of a Φ10 mm quartz tube. Then the compound $NH_4B_4O_6F$ and the flux $B_2O_3$ were mixed at a molar ratio of 1:10, and placed into the quartz tube. The quartz tube was vacuumized to reach a vacuum degree of $1\times10^{-3}$ Pa and sealed with a flame gun.

Then the quartz tube was placed into a muffle furnace. The temperature was raised to 500° C. at a rate of 40° C./h and kept for 45 h, then reduced to 450° C. at a rate of 3° C./day, and then reduced to 30° C. at a rate of 6° C./h, and the quartz tube was cut to obtain the $NH_4B_4O_6F$ crystal with a size of 7 mm×6 mm×4 mm.

Example 16: Growth of the $NH_4B_4O_6F$ Crystal by the Bridgman-Stockbarger Method The compound $NH_4B_4O_6F$ was synthesized according to the specific operation steps in Example 1 based on the reaction equation $NH_4F+2B_2O_3 \rightarrow NH_4B_4O_6F$.

The resultant compound $NH_4B_4O_6F$ was placed into a Φ10 mm quartz tube. The quartz tube was vacuumized to reach a vacuum degree of $1\times10^{-3}$ Pa and sealed with a flame gun and then placed into a muffle furnace. The temperature was raised to 600° C. at a rate of 40° C./h and kept for 48 h and then reduced to 30° C. at a rate of 5° C./h, and the hydrothermal reactor or the quartz tube was opened to obtain a seed crystal of $NH_4B_4O_6F$.

The resultant seed crystal was placed at the bottom of a platinum crucible and then the resultant compound $NH_4B_4O_6F$ were placed into the platinum crucible.

The platinum crucible was sealed and placed into a Bridgman-Stockbarger furnace. The temperature was raised to 300° C. and kept for 10 h. The position of the platinum crucible was adjusted to allow the compound $NH_4B_4O_6F$ to nucleate spontaneously. Then the platinum crucible was lowered at a rate of 0.05 mm/h slowly while the growth temperature was kept constant. The temperature of the furnace was reduced to 30° C. after the growth of the crystal is completed, and the platinum crucible was removed to obtain the $NH_4B_4O_6F$ crystal with a size of 6 mm×8 mm×12 mm.

Example 17: Growth of the $NH_4B_4O_6F$ Crystal by the Bridgman-Stockbarger Method The compound $NH_4B_4O_6F$ was synthesized according to the specific operation steps in Example 1 based on the reaction equation $NH_4F+4H_3BO_3 \rightarrow NH_4B_4O_6F+6H_2O\uparrow$.

The resultant compound $NH_4B_4O_6F$ was sealed in a hydrothermal reactor, and the hydrothermal reactor was placed into a drying oven. The temperature was raised to 200° C. at a rate of 20° C./h and kept for 10 h and then reduced to 30° C. at a rate of 1° C./h, and the hydrothermal reactor was opened to obtain a seed crystal of $NH_4B_4O_6F$.

The resultant seed crystal was placed at the bottom of an iridium crucible and then the resultant compound $NH_4B_4O_6F$ were placed into the iridium crucible.

The iridium crucible was sealed and placed into a Bridgman-Stockbarger furnace. The temperature was raised to 600° C. and kept for 20 h. The position of the iridium crucible was adjusted to allow the compound $NH_4B_4O_6F$ to inoculate at 350° C. Then the iridium crucible was lowered at a rate of 2 mm/h slowly while the temperature was reduced slowly at a rate of 3° C./h. The temperature of the furnace was reduced to 30° C. after the growth of the crystal is completed, and the iridium crucible was removed to obtain the $NH_4B_4O_6F$ crystal with a size of 7 mm×6 mm×5 mm.

Example 18: Growth of the $NH_4B_4O_6F$ Crystal by the Bridgman-Stockbarger Method The compound $NH_4B_4O_6F$ was synthesized according to the specific operation steps in Example 1 based on the reaction equation $NH_4F+2B_2O_3 \rightarrow NH_4B_4O_6F$.

The resultant compound $NH_4B_4O_6F$ was placed into a Φ10 mm quartz tube. The quartz tube was vacuumized to reach a vacuum degree of $1\times10^{-3}$ Pa and sealed with a flame gun and then placed into a muffle furnace. The temperature was raised to 400° C. at a rate of 30° C./h and kept for 36 h and then reduced to 30° C. at a rate of 3° C./h, and the quartz tube was cut to obtain a seed crystal of $NH_4B_4O_6F$.

The resultant seed crystal was placed at the bottom of a ceramic crucible and then the resultant compound $NH_4B_4O_6F$ were placed into the ceramic crucible.

The ceramic crucible was sealed and placed into a Bridgman-Stockbarger furnace. The temperature was raised to 400° C. and kept for 15 h. The position of the ceramic crucible was adjusted to allow the compound $NH_4B_4O_6F$ to inoculate at 500° C. Then the ceramic crucible was lowered at a rate of 0.5 mm/h slowly while the growth temperature was kept constant. The temperature of the furnace was reduced to 30° C. after the growth of the crystal is completed, and the ceramic crucible was removed to obtain the $NH_4B_4O_6F$ crystal with a size of 6 mm×8 mm×12 mm.

Example 19: Growth of the $NH_4B_4O_6F$ Crystal by the Bridgman-Stockbarger Method The compound $NH_4B_4O_6F$ was synthesized according to the specific operation steps in Example 1 based on the reaction equation $NH_4F+4H_3BO_3 \rightarrow NH_4B_4O_6F+6H_2O\uparrow$.

The resultant compound $NH_4B_4O_6F$ was sealed in a hydrothermal reactor and the hydrothermal reactor was placed into a drying oven. The temperature was raised to 200° C. at a rate of 20° C./h and kept for 10 h and then reduced to 30° C. at a rate of 1° C./h, and the hydrothermal reactor was opened to obtain a seed crystal of $NH_4B_4O_6F$.

The resultant seed crystal was placed at the bottom of a quartz tube and then the resultant compound $NH_4B_4O_6F$ were placed into the quartz tube.

The quartz tube was vacuumized to reach a vacuum degree of $1\times10^{-3}$ Pa and sealed with a flame gun. Then the quartz tube was placed into a Bridgman-Stockbarger furnace. The temperature was raised to 600° C. and kept for 20 h. The position of the quartz tube was adjusted to allow the compound $NH_4B_4O_6F$ to inoculate at 600° C. Then the quartz tube was lowered at a rate of 1 mm/h slowly while the temperature was reduced slowly at a rate of 2° C./h. The temperature of the furnace was reduced to 30° C. after the growth of the crystal is completed, and the quartz tube was removed to obtain the $NH_4B_4O_6F$ crystal with a size of 7 mm 6 mm×5 mm.

Example 20 Growth of the $NH_4B_4O_6F$ Crystal by the Solvothermal Method

The compound $NH_4B_4O_6F$ was synthesized according to the specific operation steps in Example 2 based on the reaction equation $NH_4F+4H_3BO_3 \rightarrow NH_4B_4O_6F+6H_2O\uparrow$.

The resultant compound $NH_4B_4O_6F$ was sealed in a hydrothermal reactor and the hydrothermal reactor was placed into a drying oven. The temperature was raised to 200° C. at a rate of 20° C./h and kept for 10 h and then reduced to 30° C. at a rate of 1° C./h, and the hydrothermal reactor was opened to obtain a seed crystal of $NH_4B_4O_6F$.

The resultant seed crystal was placed at the bottom of the polytetrafluoroethylene lining of a hydrothermal reactor having a volume of 23 mL, and then the resultant compound $NH_4B_4O_6F$ was placed into the polytetrafluoroethylene lining.

The solvent of deionized water was added to the polytetrafluoroethylene lining. The hydrothermal reactor was screwed tightly to be sealed and then was placed into a drying oven. The temperature was raised to 150° C. at a rate of 20° C./h and kept for 24 h, then reduced to 100° C. at a rate of 2° C./day and then reduced to 30° C. at a rate of 2° C./h, and the hydrothermal reactor was opened to obtain the $NH_4B_4O_6F$ crystal with a size of 5 mm×6 mm×8 mm.

Example 21 Growth of the $NH_4B_4O_6F$ Crystal by the Solvothermal Method

The compound $NH_4B_4O_6F$ was synthesized according to the specific operation steps in Example 2 based on the reaction equation $NH_4F+4H_3BO_3 \rightarrow NH_4B_4O_6F+6H_2O\uparrow$.

The resultant compound $NH_4B_4O_6F$ was placed at the bottom of the polytetrafluoroethylene lining of a hydrothermal reactor having a volume of 23 mL, and the hydrothermal reactor was placed into a drying oven. The temperature was raised to 200° C. at a rate of 20° C./h and kept for 10 h and then reduced to 30° C. at a rate of 1° C./h, and the hydrothermal reactor was opened to obtain a seed crystal of $NH_4B_4O_6F$.

The resultant seed crystal was placed at the bottom of the polytetrafluoroethylene lining of a hydrothermal reactor, and then the resultant compound $NH_4B_4O_6F$ was placed into the polytetrafluoroethylene lining of the hydrothermal reactor.

The solvent of 10 mL N,N-dimethylformamide was added to the polytetrafluoroethylene lining of the hydrothermal reactor. The hydrothermal reactor was screwed tightly to be sealed and then was placed into a drying oven. The temperature was raised to 150° C. at a rate of 20° C./h and kept for 24 h, then reduced to 100° C. at a rate of 2° C./day and then reduced to 30° C. at a rate of 2° C./h, and the hydrothermal reactor was opened to obtain the $NH_4B_4O_6F$ crystal with a size of 5 mm×6 mm×8 mm.

Example 22 Growth of the $NH_4B_4O_6F$ Crystal by the Solvothermal Method

The compound $NH_4B_4O_6F$ was synthesized according to the specific operation steps in Example 2 based on the reaction equation $NH_4F+2B_2O_3 \rightarrow NH_4B_4O_6F$.

The resultant compound $NH_4B_4O_6F$ was placed at the bottom of a hydrothermal reactor having a volume of 100 mL and lined with stainless steel with a platinum sleeve, and the hydrothermal reactor was placed into a muffle furnace. The temperature was raised to 300° C. at a rate of 30° C./h and kept for 15 h and then reduced to 30° C. at a rate of 2° C./h, and the hydrothermal reactor was opened to obtain a seed crystal of $NH_4B_4O_6F$.

The resultant seed crystal was placed at the bottom of a hydrothermal reactor lined with stainless steel with a platinum sleeve, and then the resultant compound $NH_4B_4O_6F$ were placed into the hydrothermal reactor lined with stainless steel with the platinum sleeve.

The solvent of 50 mL deionized water was added to the hydrothermal reactor lined with stainless steel with the platinum sleeve. The hydrothermal reactor was screwed tightly to be sealed and then was placed into a muffle furnace. The temperature was raised to 250° C. at a rate of 30° C./h and kept for 24 h, then reduced to 200° C. at a rate of 2° C./day and then reduced to 30° C. at a rate of 5° C./h, and the hydrothermal reactor was opened to obtain the $NH_4B_4O_6F$ crystal with a size of 5 mm×6 mm×8 mm.

Example 23 Growth of the $NH_4B_4O_6F$ Crystal by the Solvothermal Method

The compound $NH_4B_4O_6F$ was synthesized according to the specific operation steps in Example 2 based on the reaction equation $NH_4F+4H_3BO_3 \rightarrow NH_4B_4O_6F+6H_2O\uparrow$.

The resultant compound $NH_4B_4O_6F$ was placed at the bottom of a hydrothermal reactor having a volume of 150 mL and lined with stainless steel with a platinum sleeve, and the hydrothermal reactor was placed into a muffle furnace. The temperature was raised to 500° C. at a rate of 35° C./h and kept for 48 h and then reduced to 30° C. at a rate of 4° C./h, and the hydrothermal reactor was opened to obtain a seed crystal of $NH_4B_4O_6F$.

The resultant seed crystal was placed at the bottom of a hydrothermal reactor lined with stainless steel with a platinum sleeve, and then the resultant compound $NH_4B_4O_6F$ were placed into the hydrothermal reactor lined with stainless steel with the platinum sleeve.

The solvent of 80 mL hydrofluoric acid was added to the hydrothermal reactor lined with stainless steel with the platinum sleeve. The hydrothermal reactor was screwed tightly to be sealed and then was placed into a muffle furnace. The temperature was raised to 600° C. at a rate of 40° C./h and kept for 48 h, then reduced to 550° C. at a rate of 3° C./day and then reduced to 30° C. at a rate of 10° C./h, and the hydrothermal reactor was opened to obtain the $NH_4B_4O_6F$ crystal with a size of 5 mm×6 mm×8 mm.

Example 24 Growth of the $NH_4B_4O_6F$ Crystal by the Solvothermal Method

The compound $NH_4B_4O_6F$ was synthesized according to the specific operation steps in Example 2 based on the reaction equation $NH_4F+4H_3BO_3 \rightarrow NH_4B_4O_6F+6H_2O\uparrow$.

The resultant compound $NH_4B_4O_6F$ was placed at the bottom of the polytetrafluoroethylene lining of a hydrothermal reactor having a volume of 23 mL, and the hydrothermal reactor was placed into a drying oven. The temperature was raised to 220° C. at a rate of 40° C./h and kept for 48 h and then reduced to 30° C. at a rate of 5° C./h, and the hydrothermal reactor was opened to obtain a seed crystal of $NH_4B_4O_6F$.

The resultant seed crystal was placed at the bottom of the polytetrafluoroethylene lining of a hydrothermal reactor, and then the resultant compound $NH_4B_4O_6F$ was placed into the polytetrafluoroethylene lining of the hydrothermal reactor.

The solvent of 10 mL N,N-dimethylacetamide was added to the polytetrafluoroethylene lining of the hydrothermal reactor. The hydrothermal reactor was screwed tightly to be sealed and then was placed into a drying oven. The temperature was raised to 210° C. at a rate of 40° C./h and kept for 35 h, then reduced to 160° C. at a rate of 3° C./day and then reduced to 30° C. at a rate of 4° C./h, and the hydrothermal reactor was opened to obtain the $NH_4B_4O_6F$ crystal with a size of 5 mm×6 mm×8 mm.

Example 25

Figure 5:
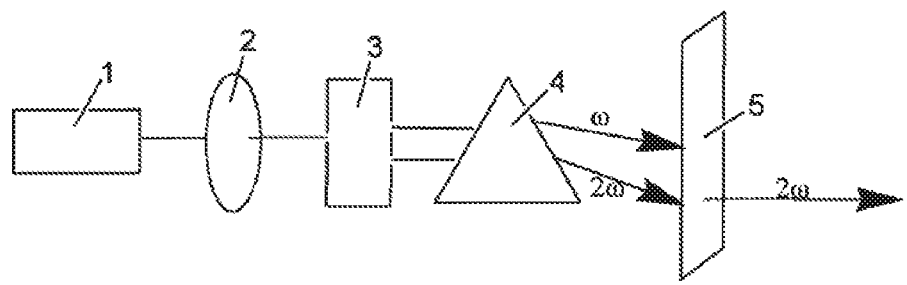
FIG. 5 illustrating the operating principle of the nonlinear optical device made of the $NH_4B_4O_6F$ crystal of the present invention, wherein 1 is a laser, 2 is convex lens, 3 is an $NH_4B_4O_6F$ crystal, 4 is convex lens, and 5 is a high relective lens.

The $NH_4B_4O_6F$ crystal obtained in any one of Examples 1-24 was processed in the direction of phase matching, and placed in position 3 as shown in FIG. 5. A Q-switched Nd:YAG laser is used as a light source at room temperature, and the incident wavelength is 1064 nm. The Q-switched Nd:YAG laser 1 emits an infrared beam 2 with a wavelength of 1064 nm, which is then transmitted to an $NH_4B_4O_6F$ crystal 3, thus generating a green frequency-multiplied light with a wavelength of 532 nm, and the intensity of the output beam is about 3 times of that from KDP in the same condition.

Example 26

The $NH_4B_4O_6F$ crystal obtained in any one of Examples 1-24 was processed in the direction of phase matching, and placed in position 3 as shown in FIG. 5. A Q-switched Nd:YAG laser is used as a light source at room temperature, and the incident wavelength is 532 nm. The Q-switched Nd:YAG laser 1 emits an infrared beam 2 with a wavelength of 532 nm, which is then transmitted to an $NH_4B_4O_6F$ crystal 3, thus generating a frequency-multiplied light with a wavelength of 266 nm, and the intensity of the output beam is about 1.5 times of that from BBO in the same condition.

Example 27

The $NH_4B_4O_6F$ crystal obtained in any one of Examples 1-24 was processed in the direction of phase matching, and placed in position 3 as shown in FIG. 5. A Q-switched Nd:YAG laser is used as a light source at room temperature, and the incident wavelength is 355 nm. The Q-switched Nd:YAG laser 1 emits an infrared beam 2 with a wavelength of 355 nm, which is then transmitted to an $NH_4B_4O_6F$ crystal 3, and the outputting of a deep-ultraviolet frequency-multiplied light with a wavelength of 177.3 nm can be observed.

What is claimed is:

1. A compound ammonium fluoroborate, wherein a chemical formula of the compound ammonium fluoroborate is $NH_4B_4O_6F$ and a molecular weight of the compound ammonium fluoroborate is 176.28.

2. A method for preparing a compound ammonium fluoroborate, wherein a chemical formula of the compound ammonium fluoroborate is $NH_4B_4O_6F$ and a molecular weight of the compound ammonium fluoroborate is 176.28; the method adopts a solid phase reaction process and comprises the steps of:

mixing an $NH_4$-containing compound, a Boron-containing compound, and a Fluorine-containing compound evenly at a molar ratio of $NH_4$:B:F=(0.5-2):(3-5):(0.5-2) to obtain a mixture, sealing the mixture in a hydrothermal reactor or a quartz tube, placing the hydrothermal reactor or the quartz tube into a muffle furnace or a drying oven, raising a temperature to 150-580° C. at a rate of 20-40° C./h and keeping the temperature for 10-48 h, then reducing the temperature to 30° C. at a rate of 1-10° C./h, and opening the hydrothermal reactor or the quartz tube to obtain the compound ammonium fluoroborate;

a chemical formula of the $NH_4$-containing compound is $NH_4F$, a chemical formula of the Boron-containing compound is $H_3BO_3$ or $B_2O_3$, and a chemical formula of the Fluorine-containing compound is $NH_4F$ or HF.

3. A nonlinear optical crystal of ammonium fluoroborate, wherein a chemical formula of the nonlinear optical crystal is $NH_4B_4O_6F$ and a molecular weight of the nonlinear optical crystal is 176.28; the nonlinear optical crystal is an orthorhombic crystal, a space group of the nonlinear optical crystal is $Pna2_1$, and the nonlinear optical crystal has the following cell parameters: a=7.615(3) Å, b=11.207(4) Å, c=6.604(3) Å, Z=4, V=563.6 Å$^3$.

4. A method for preparing a nonlinear optical crystal of ammonium fluoroborate, wherein a chemical formula of the nonlinear optical crystal is $NH_4B_4O_6F$ and a molecular weight of the nonlinear optical crystal is 176.28; the nonlinear optical crystal is an orthorhombic crystal, a space group of the nonlinear optical crystal is $Pna2_1$, and the nonlinear optical crystal has the following cell parameters: a=7.615(3) Å, b=11.207(4) Å, c=6.604(3) Å, Z=4, V=563.6 Å$^3$; the nonlinear optical crystal grown by a flux method, a Bridgman-Stockbarger method, a room temperature solution method or a solvothermal method;

the room temperature solution method for growing the nonlinear optical crystal of ammonium fluoroborate comprises the following steps:
 a. mixing an $NH_4$-containing compound, a Boron-containing compound, and a Flurine-containing compound evenly at a molar ratio of $NH_4$:B:F=(0.5-2):(3-5):(0.5-2) to obtain a mixture, sealing the mixture in a hydrothermal reactor or a quartz tube, placing the hydrothermal reactor or the quartz tube into a muffle furnace or a drying oven, raising a first temperature to 150-580° C. at a rate of 20-40° C./h and keeping the first temperature for 10-48 h, then reducing the first temperature to 30° C. at a rate of 1-10° C./h, and opening the hydrothermal reactor or the quartz tube and removing the mixture to obtain a compound $NH_4B_4O_6F$;
 a chemical formula of the $NH_4$-containing compound is $NH_4F$, a chemical formula of the Boron-containing compound is $H_3BO_3$ or $B_2O_3$, and a chemical formula of the Fluorine-containing compound is $NH_4F$ or HF;
 b. sealing the compound $NH_4B_4O_6F$ obtained in step a in the hydrothermal reactor or the quartz tube, placing the hydrothermal reactor or the quartz tube into the muffle furnace or the drying oven, raising a second temperature to 200-600° C. at a rate of 20-40° C./h and keeping the second temperature for 10-48 h, then reducing the second temperature to 30° C. at a rate of 1-5° C./h, and opening the hydrothermal reactor or the quartz tube to obtain a seed crystal of the $NH_4B_4O_6F$;
 c. placing the seed crystal obtained in step b at a bottom of a container, and then placing the compound $NH_4B_4O_6F$ obtained in step a into the container;
 d. sealing the container in step c or sealing the container in step c after an addition of 10-100 mL of a solvent, placing the container into the muffle furnace or the drying oven, raising a third temperature to 150-600° C. at a rate of 20-40° C./h and keeping the third temperature for 10-48 h, then reducing the third temperature to 50° C. at a rate of 1-3° C./day, and then reducing the third temperature to 30° C. at a rate of 1-10° C./h, and opening the container to obtain the nonlinear optical crystal of ammonium fluoroborate, a size of the nonlinear optical crystal is 1-20 mm; the solvent is deionized water, anhydrous ethanol, N,N-dimethylformamide, N,N-dimethylacetamide or hydrofluoric acid;

the flux method for growing the nonlinear optical crystal of ammonium fluoroborate comprises the following steps:
 a. mixing an $NH_4$-containing compound, a Boron-containing compound, and a Fluorine-containing compound evenly at a molar ratio of $NH_4$:B:F=(0.5-2):(3-5):(0.5-2) to obtain a mixture, sealing the mixture in a hydrothermal reactor or a first quartz tube, placing the hydrothermal reactor or the first quartz tube into a muffle furnace or a drying oven, raising a first temperature to 150-580° C. at a rate of 20-40° C./h and keeping the first temperature for 10-48 h, then reducing the first temperature to 30° C. at a rate of 1-10° C./h, and opening the hydrothermal reactor or the first quartz tube to obtain a compound $NH_4B_4O_6F$;
 a chemical formula of the $NH_4$-containing compound is $NH_4F$, a chemical formula of the Boron-containing compound is $H_3BO_3$ or $B_2O_3$, and a chemical formula of the Fluorine-containing compound is $NH_4F$ or HF;
 b. sealing the compound $NH_4B_4O_6F$ obtained in step a in the hydrothermal reactor or the first quartz tube, placing the hydrothermal reactor or the first quartz tube into the muffle furnace or the drying oven, raising a second temperature to 200-600° C. at a rate of 20-40° C./h and keeping the second temperature for 10-48 h, then reducing the second temperature to 30° C. at a rate of 1-5° C./h, and opening the hydrothermal reactor or the first quartz tube to obtain a seed crystal of the $NH_4B_4O_6F$;
 c. placing the seed crystal of the $NH_4B_4O_6F$ obtained in step b at a bottom of a second quartz tube, then mixing the compound $NH_4B_4O_6F$ obtained in step a with a flux at a molar ratio of 1:(1-10) to obtain a mix and placing the mix into the second quartz tube, and the second quartz tube was lame-sealed under $10^{-3}$ Pa with a flame gun; a chemical formula of the flux is $NH_4F$, $NH_4F$:$H_3BO_3$, $NH_4F$:$B_2O_3$, $H_3BO_3$ or $B_2O_3$;
 d. sealing the second quartz tube in step c or sealing the second quartz tube in step c after an addition of 10-100 mL of a solvent, placing the second quartz tube into the muffle furnace or the drying oven, raising a third temperature to 150-600° C. at a rate of 20-40° C./h and keeping the third temperature for 10-48 h, then reducing the third temperature to 50° C. at a rate of 1-3° C./day, and then reducing the third temperature to 30° C. at a rate of 1-10° C./h, and opening the second quartz tube and removing a product to obtain the nonlinear optical crystal of ammonium fluoroborate, a size of the nonlinear optical crystal is 1-20 mm; the solvent is deionized water, anhydrous ethanol, N,N-dimethylformamide, N,N-dimethylacetamide or hydrofluoric acid;

the Bridgman-Stockbarger method for growing the nonlinear optical crystal of ammonium fluoroborate comprises the following steps:
 a. mixing an $NH_4$-containing compound, a Boron-containing compound, and a Flurine-containing compound evenly at a molar ratio of $NH_4$:B:F=(0.5-2):(3-5):(0.5-2) to obtain a mixture, sealing the mixture in a hydrothermal reactor or a quartz tube, placing the hydrothermal reactor or the quartz tube into a muffle furnace or a drying oven, raising a first temperature to 150-580° C. at a rate of 20-40° C./h and keeping the first temperature for 10-48 h, then reducing the first temperature to 30° C. at a rate of 1-10° C./h, and opening the hydrothermal reactor or the quartz tube and removing the mixture to obtain a compound $NH_4B_4O_6F$;

a chemical formula of the $NH_4$-containing compound is $NH_4F$, a chemical formula of the Boron-containing compound is $H_3BO_3$ or $B_2O_3$, and a chemical formula of the Fluorine-containing compound is $NH_4F$ or HF;

b. sealing the compound $NH_4B_4O_6F$ obtained in step a in the hydrothermal reactor or the quartz tube, placing the hydrothermal reactor or the quartz tube into the muffle furnace or the drying oven, raising a second temperature to 200-600° C. at a rate of 20-40° C./h and keeping the second temperature for 10-48 h, then reducing the second temperature to 30° C. at a rate of 1-5° C./h, and opening the hydrothermal reactor or the quartz tube to obtain a seed crystal of the $NH_4B_4O_6F$;

c. placing the seed crystal obtained in step b at a bottom of a container, and then placing the compound $NH_4B_4O_6F$ obtained in step a into the container;

d. sealing the container in step c and placing the container into a Bridgman-Stockbarger furnace, raising a third temperature to 300-600° C. and keeping the third temperature for 10-20 h, adjusting a position of the container to allow the compound $NH_4B_4O_6F$ to spontaneously nucleate or inoculate at 350-600° C., then lowering the container at a rate of 0.05-2 mm/h slowly while keeping a growth temperature constant or reducing the growth temperature slowly at a rate of 0-3° C./h, then reducing the third temperature of the Bridgman-Stockbarger furnace to 30° C. after a growth of the nonlinear optical crystal is completed, and removing the container to obtain the nonlinear optical crystal of ammonium fluoroborate, a size of the nonlinear optical crystal is 1-20 mm;

the solvothermal method for growing the nonlinear optical crystal of ammonium fluoroborate comprises the following steps:

a. mixing an $NH_4$-containing compound, a Boron-containing compound, and an Fluorine-containing compound evenly at a molar ratio of $NH_4$:B:F=(0.5-2):(3-5):(0.5-2) to obtain a first mixture, sealing the first mixture in a hydrothermal reactor or a quartz tube, placing the hydrothermal reactor or the quartz tube into a muffle furnace or a drying oven, raising a first temperature to 150-580° C. at a rate of 20-40° C./h and keeping the first temperature for 10-48 h, then reducing the first temperature to 30° C. at a rate of 1-10° C./h, and opening the hydrothermal reactor or the quartz tube to obtain a compound $NH_4B_4O_6F$;

a chemical formula of the $NH_4$-containing compound is $NH_4F$, a chemical formula of the Boron-containing compound is $H_3BO_3$ or $B_2O_3$, and a chemical formula of the Fluorine-containing compound is $NH_4F$ or HF;

b. sealing the compound $NH_4B_4O_6F$ obtained in step a in the hydrothermal reactor or the quartz tube, placing the hydrothermal reactor or the quartz tube into the muffle furnace or the drying oven, raising a second temperature to 200-600° C. at a rate of 20-40° C./h and keeping the second temperature for 10-48 h, then reducing the second temperature to 30° C. at a rate of 1-5° C./h, and opening the hydrothermal reactor or the quartz tube to obtain a seed crystal of the $NH_4B_4O_6F$;

c. placing the seed crystal obtained in step b at a bottom of a container, and then placing the compound $NH_4B_4O_6F$ obtained in step a into the container;

d. adding 10-100 mL of a solvent to the container in step c to obtain a second mixture, then subjecting the second mixture to ultrasonication to make the second mixture mix and dissolve thoroughly, adjusting a pH value of the second mixture to pH=1-11, performing a filtration with a qualitative filter paper, then sealing the container with a polyvinyl chloride film, a plurality of small holes are arranged in the polyvinyl chloride film and punched to adjust a volatilization rate of the solvent in the second mixture, and placing the container into a static environment without shaking, pollution and air convection, and leaving the second mixture to stand at room temperature to allow the nonlinear optical crystal to grow, so as to obtain the nonlinear optical crystal of ammonium fluoroborate, a size of the nonlinear optical crystal is 1-20 mm at an end of a crystal growth; the solvent is deionized water, anhydrous ethanol, N,N-dimethylformamide, N,N-dimethylacetamide or hydrofluoric acid.

5. The method for preparing the nonlinear optical crystal of ammonium fluoroborate of claim 4, wherein in step c of the steps of the flux method, a molar ratio of $NH_4F$ to $H_3BO_3$ in a flux system of $NH_4F$—$H_3BO_3$ is (1-3):(1-5); and a molar ratio of $NH_4F$ to $B_2O_3$ in a $NH_4F$—$B_2O_3$ system is (1-2):(1-4).

6. A method of producing a harmonic light, wherein the method comprises: using a nonlinear optical crystal of ammonium fluoroborate, wherein a chemical formula of the nonlinear optical crystal is $NH_4B_4O_6F$ and a molecular weight of the nonlinear optical crystal is 176.28; the nonlinear optical crystal is an orthorhombic system, a space group of the nonlinear optical crystal is $Pna2_1$, and the nonlinear optical crystal has the following cell parameters: a=7.615(3) Å, b=11.207(4) Å, c=6.604(3) Å, Z=4, V=563.6 Å$^3$; the harmonic light is a frequency-doubled, a frequency-tripled, a frequency-quadrupled, a frequency-quintupled or a frequency-sextupled harmonic light from a 1064 nm fundamental frequency light output from a Nd:YAG laser.

7. The method of claim 6, wherein the method comprises using the nonlinear optical crystal of ammonium fluoroborate in a production of a deep-ultraviolet frequency-multiplied light below 200 nm.

8. A method of making a frequency multiplication generator, a frequency up or down converter or an optical parametric oscillator, wherein the method comprises using a nonlinear optical crystal of ammonium fluoroborate, a chemical formula of the nonlinear optical crystal is $NH_4B_4O_6F$ and a molecular weight of the nonlinear optical crystal is 176.28; the nonlinear optical crystal is an orthorhombic system, a space group of the nonlinear optical crystal is $Pna2_1$, and the nonlinear optical crystal has the following cell parameters: a=7.615(3) Å, b=11.207(4) Å, c=6.604(3) Å, Z=4, V=563.6 Å$^3$.

* * * * *